(12) United States Patent
Yu

(10) Patent No.: US 6,420,991 B1
(45) Date of Patent: Jul. 16, 2002

(54) DYNAMIC ELEMENT MATCHING FOR CONVERTING ELEMENT MISMATCH INTO WHITE NOISE FOR A PIPELINED ANALOG TO DIGITAL CONVERTER

(75) Inventor: Paul C. Yu, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/391,968

(22) Filed: Sep. 8, 1999

(51) Int. Cl.$^7$ ................................. H03M 1/38

(52) U.S. Cl. ...................... 341/161; 341/118; 341/120; 341/159; 341/141; 341/155; 341/163; 341/172; 341/143

(58) Field of Search ................................ 341/161, 163, 341/155, 159, 141, 347, 172, 143, 118, 120

(56) References Cited

U.S. PATENT DOCUMENTS

| | | | |
|---|---|---|---|
| 5,006,854 A | * 4/1991 | White et al. | ................. 341/172 |
| 5,404,142 A | 4/1995 | Adams et al. | |
| 5,412,387 A | 5/1995 | Vincelette et al. | |
| 5,416,485 A | 5/1995 | Lee | |
| 5,594,445 A | 1/1997 | Ginetti | |
| 5,764,176 A | 6/1998 | Ginetti | |
| 6,118,400 A | * 9/2000 | Susak | .......................... 341/172 |
| 6,137,431 A | * 10/2000 | Lee et al. | .................... 341/161 |
| 6,348,888 B1 | * 2/2002 | Yu | .............................. 341/161 |

OTHER PUBLICATIONS

A 12–bit 1 Msampel/s Capacitor Error–Averaging Pipelined A/D Converter, IEEE vol.23, No. 6 12/1988 by Bang Sup Song.*

A. Shabra et al., "Oversampled Pipeline A/D Converters with Mismatch Sampling," IEE, Electronic Letters, vol. 34, Issue 6, pp. 508–509, Mar. 19, 1998.

Ning He et al., "Double–Loop Sigma–Delta Modulation with dc Input," IEEE Trans. Commun., vol. COM–38, pp. 487–495, Apr. 1990.

Bang–Sup Song et al., "A 12–Bit 1–Msample/s Capacitor Error–Averaging Pipelined A/D Converter," IEEE Journal of Solid–State Circuits, vol. 23, No. 6, pp. 1324–1333, Dec. 1998.

Todd L. Brooks et al., "A 16bΣΔ Pipeline ADC with 2.5 MHz Output Data–Rate," IEEE International Solid State Circuits Conference, pp. 208–209, 458, Feb. 7, 1997.

Paul C. Yu et al., "A Pipeline A/D Conversion Technique with Near–Inhertent Monotonicity," IEEE Transactions on Circuits and Systems –II: Analog and Digital Signal Processing, vol. 42, No. 7, pp. 500–502, Jul. 1995.

(List continued on next page.)

*Primary Examiner*—Michael Tokar
*Assistant Examiner*—Lam T. Mai
(74) *Attorney, Agent, or Firm*—J. Dennis Moore; W. James Brady, III; Frederick J. Telecky, Jr.

(57) ABSTRACT

A method for practice in a pipelined analog to digital converter. The method converts an analog signal to a sequence of digital words, while converting capacitor mismatch in the stages of the ADC into white noise. In the method, for each of one or more of the pipelined stages, first, the plurality of capacitors therein is coupled at a sample time between the stage input port and ground. Second, during an amplifying period following the sample time, one or more of the plurality of capacitors are coupled between a reference voltage and the input port of the amplifier, while the remainder of the plurality of capacitors are coupled between the input port of the amplifier and the output port of the amplifier, such that different ones of the plurality of capacitors are selected, according to a predetermined procedure uncorrelated with the analog signal, for coupling between the stage input port and ground.

14 Claims, 2 Drawing Sheets

OTHER PUBLICATIONS

Ping Wai Li et al., "A Ratio–Independent Algorithmic Analog–to–Digital Conversion Technique," IEEE Journal of Solid–State Circuits, vol. SC–19, No. 6, pp. 828–836, Dec. 1984.

Cheng–Chung Shih et al., "Reference Refreshing Cyclic Analog–to–Digital and Digital–to–Analog Converters," IEEE Journal of Solid State Circuits, vol. SC–21, No. 4, pp. 544–554, Aug. 1986.

Rex T. Baird and Terri S. Fiez, "Improved $\Delta\Sigma$ DAC Linearity Using Data Weighted Averaging" IEEE Int. Symp. Circuits Sys., vol. 1, pp. 13–16, May 1995.

Bosco H. Leung and Sehat Sutarja, "Multibit $\Sigma\Delta$ A/D Converter Incorporating a Novel Class of Dynamic Element Matching Techniques" IEEE Transactions on Circuits and Systems –II: Analog and Digital Signal Processing, vol. 39, No. 1, p. 35–51, Jan. 1992.

Feng Chen and Bosco H. Leung, "A High Resolution Multibit Sigma–Delta Modulator with Individual Level Averaging" IEEE Journal of Solid–State Circuits, vol. 30, No. 4, pp. 453–460, Apr. 1995.

Bosco H. Leung and Sehat Sutarja, "Multibit $\Delta\Sigma$ A/D Converter Incorporating a Novel Class of Dynamic Element Matching Techniques" IEEE Transactions on Circuits and Systems –II: Analog and Digital Signal Processing, vol. 39, No. 1, p. 35–51, Jan. 1992.

L. Richard Carley, "A Noise–shaping Coder Topology for 15 Bit Converters" IEEE Journal of Solid State Circuits, vol. 24, No. 2, pp. 267–273, Apr. 1989.

Louis A. Williams, III, "An Audio DAC with 90dB Linearity Using MOS to Metal–Metal Charge Transfer" ISSCC Dig. Tech. Papers, pp. 58–59, San Francisco 1998.

* cited by examiner

US 6,420,991 B1

DYNAMIC ELEMENT MATCHING FOR CONVERTING ELEMENT MISMATCH INTO WHITE NOISE FOR A PIPELINED ANALOG TO DIGITAL CONVERTER

TECHNICAL FIELD OF THE INVENTION

The present invention relates to analog to digital converter (hereinafter "ADC") systems and, more particularly, to a method and apparatus for converting element mismatch into white noise in such systems.

BACKGROUND OF THE INVENTION

A conventional multi-bit per stage, pipelined ADC 10 is shown in FIG. 1. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 1, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 is subtracted from the input signal on line 34 by summing unit 38, and the difference signal is provided on line 46 to amplifier 48, where it is amplified by a factor of $2^m$. The difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

In a conventional pipelined ADC, there are three main error sources. The first is the A/D subconverter linearity in the form of comparator offsets. Provided that the DASC and the interstage gain are perfect, this error can typically be removed by using digital error correction. The remaining two error sources are the D/A subconverter and the interstage gain error, both of which occur if the capacitors are not perfectly matched.

In $\Sigma$-$\Delta$ ADCs, capacitor mismatch results in DASC errors only. This DASC error can be reduced by using a number of dynamic element matching ("DEM") techniques previously proposed for linearizing the DASC in multi-bit $\Sigma$-$\Delta$ ADCs. Examples of such techniques are described in L. R. Carley, "Noise Shaping Coder Typology for 15-bit Converters," IEEE *J. Solid-State Circuits*, S. C. 24 No. 2, pp. 267–273, April 1989; B. H. Leung and S. Sutarja, "Multibit $\Sigma$-$\Delta$A/D Converter Incorporating a Novel Class of Dynamic Element Matching Techniques," IEEE *Trans. Circuits and Syst. II*, Vol. 39, No. 1, pp. 35–51, January 1992; R. T. Baird and T. Fiez, "Improved $\Sigma$-$\Delta$ DAC Linearity Using Data Weighted Averaging," *Proc.* 1995 *IEEE Int. Symp. Circuits Sys.*, Vol. 1, pp. 13–16, May 1995; and R. Adams and T. Kuan, "Data-Directed Scrambler for Multi-Bit Noise Shaping D/A Converters," U.S. Pat. No. 5,404,142, Assigned to Analog Devices, Inc., Apr. 4, 1995. By using a time varying combination of elements to represent the given DASC output level, the element mismatch errors are averaged out over time, thereby linearizing the DASC.

In a pipelined ADC, capacitor mismatch results in both DASC and interstage gain error. Direct application of existing DEM techniques to pipelined ADCs is not very effective since the interstage gain error can still degrade the overall linearity of the pipeline significantly. Therefore, it is an object of the invention to provide a solution to the problem of interstage gain error in multi-bit per stage pipelined ADCs. It is also an object of the invention to provide a solution to the problem of capacitor mismatch error in a DASC in an ADC, in addition to the problem of interstage gain error. It is also an object of the present invention to reduce such errors, while maintaining sufficient simplicity in the overall ADC design so as to permit a commercially viable product including such an ADC.

SUMMARY OF THE INVENTION

The present invention provides a method for practice in a pipelined analog to digital converter of the type for converting an analog signal to a sequence of digital words, each such word representing a value of the analog signal at a sample time in a succession of sample times, and having a plurality of pipelined stages, a first stage receiving the analog signal and the other stages receiving a residue signal from a preceding stage, each stage outputting a digital value comprising one or more bits of the word, and each stage having an input port for receiving an input signal, for sampling the input signal at each of the succession of sample times and providing a residue signal having a level corresponding to the level of the input signal, minus a level corresponding to the digital value, at each of the succession of sample times. Each stage includes a plurality of capacitors, and an amplifier, and has an input port and an output port. The method converts an analog signal to a sequence of digital words, while converting capacitor mismatch in the stages of the ADC into white noise. In the method, for each of one or more of the pipelined stages, first, the plurality of capacitors is coupled at a sample time between the stage input port and ground. Second, during an amplifying period following the sample time, one or more of the plurality of capacitors are coupled between a reference voltage and the input port of the amplifier, while the remainder of the plurality of capacitors are coupled between the input port of the amplifier and the output port of the amplifier, such that different ones of the plurality of capacitors are selected, according to a predetermined procedure uncorrelated with the analog signal, for coupling between the stage input port and ground.

These and other features of the invention will be apparent to those skilled in the art from the following detailed description of the invention, taken together with the accompanying drawings.

DESCRIPTION OF THE PREFERRED EMBODIMENTS OF THE PRESENT INVENTION

Figure 1:
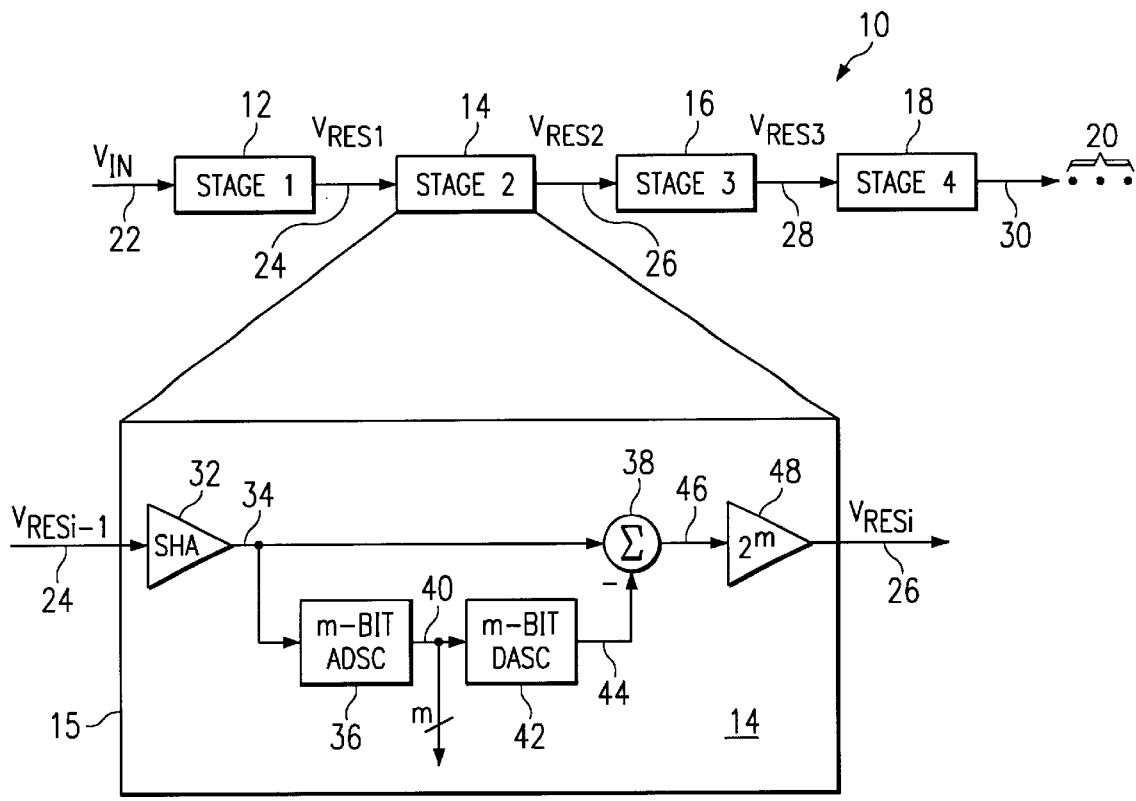
FIG. 1 is a block diagram of a prior art analog to digital converter.
Figure 2:
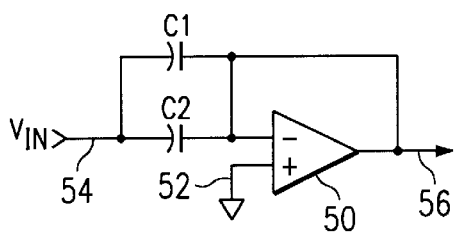
FIG. 2 is a circuit diagram of a pertinent portion of a sample and hold amplifier in a first phase configuration.

FIG. 2 is a circuit diagram of pertinent portions of a 1.5 bit ADC stage of a first type, such as ADC stage 14 of FIG. 1, configured in a first, sample phase, for use in accordance with a method of a preferred embodiment of the present invention. This first category type of ADC stage architecture is of the type in which the number of capacitors is $2^{(m-1)}$, the number of feedback capacitors is 1, and the number of comparators is $2^m-2$. In such type architectures the number of DAC reference levels is 3. In the circuit of FIG. 2, the value m is 2. The principles of the present invention involved in explaining its operation are equally applicable to circuits in which m takes other values. The designer need merely scale appropriately. It will be appreciated that the principles of the present invention are applicable as well to other architectures, for example ADC stages of the type in which the number of capacitors is $2^m$, the number of feedback capacitors is 2, and the number of comparators is $2^m-1$. In such type architectures the number of DAC reference levels is 2. Again, the principles of the present invention apply as well to such architecture types, as will be readily apparent to those of ordinary skill in the art area to which the invention pertains, once the principles of the present invention, as set forth herein, are understood.

In the circuit of FIG. 2 is a differential amplifier 50, having its non-inverting input connected to ground via a line 52. An input signal having a voltage $V_{IN}$ is provided on an input line 54 to a pair of capacitors, capacitor C1 and capacitor C2, connected in parallel between input line 54 and an inverting input of differential amplifier 50. The inverting input and output of differential amplifier 50 are connected during this phase, as shown by closed switch $S_S$. This provides a virtual ground connection for capacitors C1 and C2, so that they can charge up during the sample phase, and capture the sampled voltage $V_{IN}$ at the sample time. At the end of the sample phase, typically on the falling edge of the clock cycle controlling the sample phase, switch $S_S$ is opened, capturing that charge for use in the next, amplifying phase. It will be appreciated that other circuits and architectures may be used in which capacitors C1 and C2 or similar capacitors for such circuits or architectures, may be connected to an AC ground node, or even to DC ground.

Input line 54 is also connected to an input of a comparator 55, the other input of which is connected via line 56 to ground. The result, d, of a comparison of comparator 56 is provided at the output 57 of comparator 55. The value d may be 1, 0 or −1, depending on the value of $V_{IN}$. The value of d is used to generate the m-bit sub-word, which is the output of the ADC stage. In the configuration shown in FIG. 2, m is equal to two.

Figure 3:
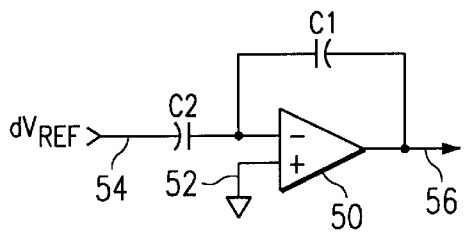
FIG. 3 is a circuit diagram of a pertinent portion of a sample and hold amplifier in a second phase configuration.

FIG. 3 shows the same circuit components shown in FIG. 2 of an ADC stage, as configured in a second, hold, or, amplifying phase. As can be seen, in this second, amplifying phase, input line 54 is now connected to a voltage reference at a level of $d \cdot V_{REF}$, where, again, d is either 1, 0, or −1, depending on the output of comparator 55, as shown by switch $S_A$. Capacitor C2 remains connected between input line 54 and the negative input of differential amplifier 50 and operates as a DASC capacitor. However, capacitor C1 has its port previously connected to input line 54 now connected to the output line 58, replacing the circuit path including switch $S_S$ in FIG. 2, and operates as a feedback capacitor.

Figure 4A:
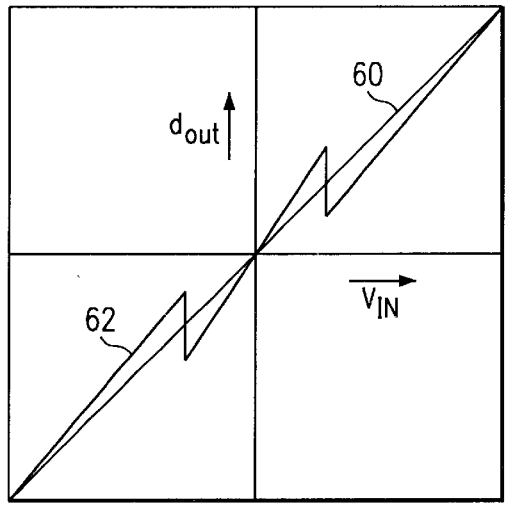
FIG. 4(A) is a graph showing a transfer curve for a 1.5 bit per stage pipelined A/D converter stage, including a two capacitor sample and hold amplifier, for C1<C2.
Figure 4B:
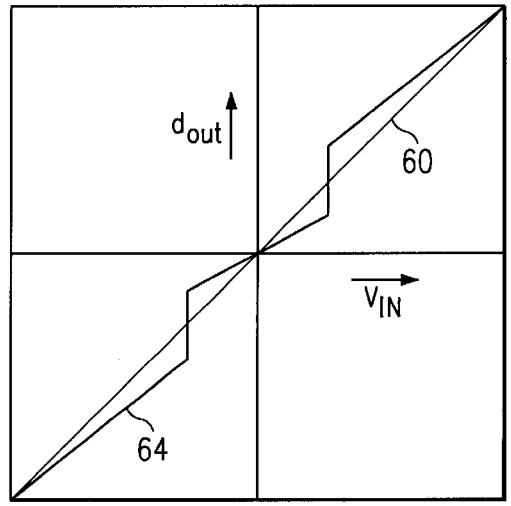
FIG. 4(B) is a graph showing a transfer curve for a 1.5 bit per stage pipelined A/D converter stage, including a two capacitor sample and hold amplifier, for C1>C2.

In conventional 1.5 bit per stage pipelined ADCs, capacitor C1 is always utilized as the feedback capacitor, while capacitor C2 is always utilized as the input connection capacitor. FIGS. 4a and 4b show a consequence of this approach. FIG. 4a and FIG. 4b are graphs of the input voltage versus the output voltage of the sample and hold amplifier of FIGS. 2 and 3, i.e., the effective transfer curve of that unit, for two cases. In FIG. 4a a curve 62 is shown for the transfer curve in the case where C1<C2. In FIG. 4b a curve 64 is shown for the transfer curve in the case where C1>C2. The ideal transfer curve is shown by a line 60 in both FIG. 4a and FIG. 4b. In the prior art, the value of C1 vs. C2 is fixed once the chip is fabricated. Therefore, in operation the ADC will have a transfer curve like curve 62, or curve 64, all the time.

In accordance with a preferred embodiment of the present invention C1 is selected as the feedback capacitor in a manner, i.e., by a procedure, that is uncorrelated with the input, and on average the same number of times as C2. By selecting C1 (FIGS. 2, 3) as the feedback capacitor on average the same number of times as C2, the effective transfer curve is a time averaged version of curves 62 and 64. This effective curve approaches the ideal curve 60. As a result, the ADC is linearized. Further, by switching from transfer curve 62 to transfer curve 64 in a manner that is uncorrelated with the input, i.e., selecting C1 or C2 as the feedback capacitor in a manner that is uncorrelated with the input, then only white noise results. This switching may be accomplished with a pseudo-random code which can be generated with digital circuits known in the art.

The inventive technique not only applies to 1.5 bit/stage as explained above, but can be generalized to multibit per stage architectures. In fact, it will be appreciated that the principles of the present invention may be implemented in many architectures, other than that shown in FIGS. 2 and 3, including in architectures that use differential signals. What makes utilization of the present invention possible is the use of multiple capacitors, designed to be the same value, and that are alternated between a sampling configuration and an amplifying configuration, as will be apparent after understanding the principles set forth herein.

Figure 5:
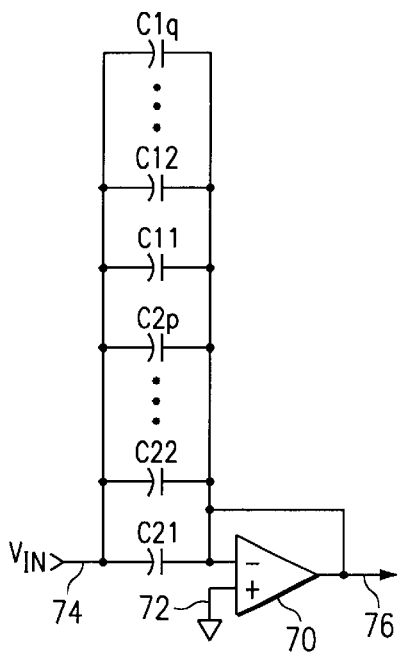
FIG. 5 is a circuit diagram of a sample and hold amplifier according to the preferred embodiment of the present invention, in a first configuration.

For example, FIG. 5 is a circuit diagram of pertinent portions of an ADC stage, shown in the sampling phase, for use in accordance with a method of another preferred embodiment of the present invention. A comparator generating a value d used to generate an m-bit sub-word is omitted from the diagram, in the interest of brevity, but it will be understood that such component exists in actual implementations. In the circuit of FIG. 5 is a differential amplifier 70, having a non-inverting input connected to ground by way of a line 72. An input line 74 provides an input voltage $V_{IN}$ to two sets of capacitors, a first set C11, C12, . . . , C1q, and a second set of capacitors C21, C22, . . . , C2p, all of which capacitors are connected in parallel between the input line 74 and an inverting input of amplifier 70. The inverting input of amplifier 70 is also connected by way of a switch $S_S$, to the output of amplifier 70, line 76, in accordance with similar principles as those discussed above with reference to switch $S_S$ in FIG. 2. Thus, switch $S_S'$ provides a virtual ground connection for capacitors C11, C12, . . . , C1q, and capacitors C21, C22, . . . , C2p, so that they can charge up during the sample phase, and capture the sampled voltage $V_{IN}$ at the sample time. As in FIG. 2, switch $S_S'$ is opened at the end of the sample phase to capture that charge for use in the next, amplifying phase.

Figure 6:
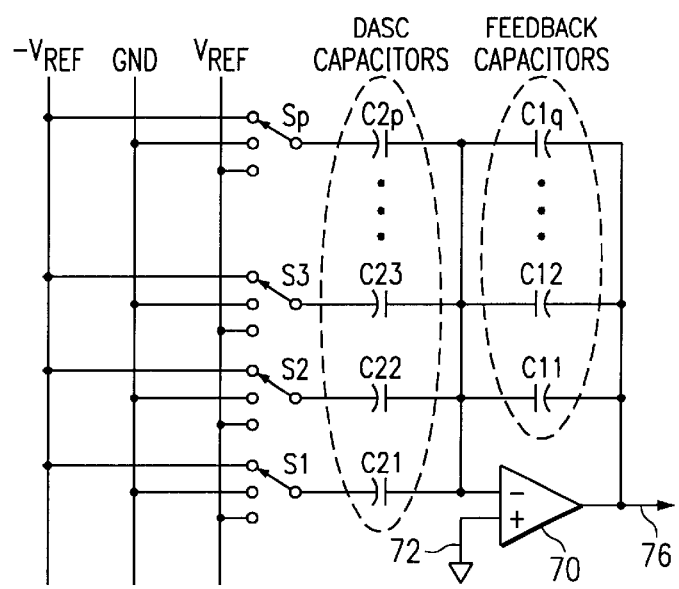
FIG. 6 is a circuit diagram of a sample and hold amplifier according to the preferred embodiment of the present invention, in a second configuration.

FIG. 6 is a circuit diagram of the circuit of FIG. 5, as configured in a second phase, that of amplification. As can be seen, in FIG. 6 the capacitors in the first group, C11, C12, . . . C1q, are now connected all in parallel as feedback capacitors between the output line 76 and the inverting input of amplifier 70. The capacitors in the second group, C21, C22, . . . C2p, are now all connected in parallel together as DASC capacitors between the negative input of amplifier 70 and to a respective one of a corresponding number of switches S1, S2, . . . Sp. Each of these switches, S1, S2, . . . Sp, allows the port of its respective DASC capacitor to be connected to $V_{REF}$, ground, or $-V_{REF}$, depending upon the position of the switch, which, again is determined by the value d output by the comparator (not shown).

During the sampling phase, as shown in FIG. 5, no changes are necessary from the conventional approach. During the amplifying phase in a conventional pipeline, the connection of the DASC capacitors are fixed once the digital code from the ADSC is determined. In addition, the feedback capacitor is usually predetermined to be C11 for all time. However, in a preferred embodiment of the present invention, the connections of the DASC capacitors to $V_{REF}$, GND, and $-V_{REF}$ are randomized, preferably with a pseudo-random code generated by a digital circuit.

Thus, it will be appreciated that the numbers p and q are themselves selectable, depending upon the performance desired versus the chip area to be occupied by the sample and hold amplifier. Out of the p number of unit capacitors, depending on the digital decisions, a selectable number i of them may be connected to $V_{REF}$, j of them to $-V_{REF}$, and k of them to GND. Over time, however, part or all of the q feedback capacitors may be used as the DASC capacitor, and vice versa.

For instance, consider the case where the number of bits per stage is three. One conventional architecture uses four capacitors per stage, with p being three and q being one. Thus, the three DASC capacitors are C21, C22 and C23, which are denominated C2, C3 and C4 in the discussion that follows, while C11 is the feedback capacitor, which is denominated C1 in the discussion that follows.

Suppose, in this case, that the analog input is such that the ADSC output is two. In a conventional pipeline, C2, as part of the DASC capacitors, is always selected to connect to $-V_{REF}$, while C3 and C4 are connected to GND. Using the technique of this preferred embodiment, however, C1 through C4 are randomly selected to connect to $-V_{REF}$. At the same time, the two connections to GND and the feedback capacitor are all randomly chosen as well. Thus, over many clock cycles, C1 might be the feedback capacitor on clock cycle one, C4 might be the feedback capacitor on clock cycle two, etc. Similarly for the DASC capacitors, even if the ADSC output is always two over many clock cycles, C2 can be the one capacitor connected to $-V_{REF}$ during clock cycle one, C1 can be the capacitor connected to $-V_{REF}$ during clock cycle two, etc. By randomizing the connection, the harmonic distortion usually associated with capacitor mismatch is converted into white noise.

In conventional architectures, the number of feedback capacitors, q, is usually one or two. The approach taken in the preferred embodiments can accommodate this and still achieve the desired white noise shuffling. This is done by providing the randomized connections of all of the capacitors, including the feedback capacitors, as described herein.

A preferred method in the application of the principles of the present invention is that on average all the capacitors are used as feedback or DASC capacitors about the same number of times. The method may be practiced with the capacitors connected to as DASC capacitors to a given reference voltage non equal times, but deviation from equal time connection degrades the performance from the optimum.

Note that the implementation shown in FIGS. 5 and 6 is of the first type discussed above, that is, one in which the number of capacitors is $2^{(m-1)}$, the number of feedback capacitors is 1, and the number of comparators is $2^m-2$. The implementation would be of the second type discussed above if the number of capacitors is $2^m$, the number of feedback capacitors is 2, and the number of comparators is $2^m-1$. Otherwise, the principles discussed above in connection with FIGS. 5 and 6 would be the same.

Finally, note that the circuits shown in FIGS. 2, 3, 5 and 6 are single ended, for ease of explanation. The principles are the same for circuits that are fully differential, and the considerations involved in implementing the present invention are essentially the same as those discussed herein, with the considerations applying to both differential paths, rather than to only the one path in a single-ended circuit.

Although the present invention and its advantages have been described in detail it should be understood that various changes, substitutions and alterations can be made herein without departing from the spirit and scope of the invention as defined by the appended claims.

What is claimed is:

1. In a pipelined analog to digital converter for converting an analog signal to a sequence of digital words, each such word representing a value of said analog signal at a sample time in a succession of sample times, having a plurality of pipelined stages, a first stage receiving said analog signal and the other stages receiving a residue signal from a preceding stage, each stage outputting a digital value comprising one or more bits of said word, and each stage having an input port for receiving an input signal, for sampling said input signal at each of said succession of sample times and providing a residue signal having a level corresponding to the level of said input signal, minus a level corresponding to said digital value, at each of said succession of sample times, said each stage comprising a plurality of capacitors, and an amplifier, having an input port and an output port;

a method for converting said analog signal to said sequence of digital words, while converting capacitor mismatch in said stage into white noise, comprising the steps of, for each of one or more of said pipelined stages:

coupling said plurality of capacitors at a sample time between said stage input port and ground; and during an amplifying period following said sample time, coupling one or more of said plurality of capacitors between a reference voltage and said input port of said amplifier, while coupling the remainder of said plurality of capacitors between said input port of said amplifier and said output port of said amplifier, such that different ones of said plurality of capacitors are selected from sample to sample, according to a predetermined procedure uncorrelated with said analog signal, for coupling between said stage input port and ground.

2. A method according to claim 1, wherein said step of coupling said plurality of capacitors at a sample time between said stage input port and ground is performed by coupling said plurality of capacitors at a sample time between said stage input port and virtual ground.

3. A method according to claim 1, wherein said step of coupling said plurality of capacitors at a sample time between said stage input port and ground is performed by coupling said plurality of capacitors at a sample time between said stage input port and an AC ground of said converter.

4. A method according to claim 1, wherein said step of coupling said plurality of capacitors at a sample time between said stage input port and ground is performed by coupling said plurality of capacitors at a sample time between said stage input port and an DC ground of said converter.

5. A method according to claim 1, wherein said reference voltage may be at one of a plurality of voltage levels.

6. A method according to claim 1, wherein said step of coupling one or more of said plurality of capacitors between a reference voltage and said input port of said amplifier is performed such that each of said plurality of capacitors is coupled between said reference voltage and said input port of said amplifier substantially the same number of times, over many of said amplifying periods.

7. A method according to claim 1, wherein said predetermined procedure is pseudo-random selection.

8. In a pipelined analog to digital converter for converting an analog signal to a sequence of digital words, each such word representing a value of said analog signal at a sample time in a succession of sample times, having a plurality of pipelined stages, a first stage receiving said analog signal and the other stages receiving a residue signal from a preceding stage, each stage outputting a digital value comprising one bit of said word, and each stage having an input port for receiving an input signal, for sampling said input signal during each of said succession of sample periods and providing a residue signal having a level corresponding to the level of said input signal, minus a level corresponding to said digital value, at each of said succession of sample times, said stage comprising a first capacitor and a second capacitor, and an amplifier, having an input port and an output port;

a method for converting said analog signal to said sequence of digital words, while converting capacitor mismatch in said stage into white noise, comprising the steps of, for each of one or more of said stages:

coupling said first capacitor and said second capacitor at a sample time between said stage input port and ground; and during an amplifying period following said sample time, coupling one of said capacitors between a reference voltage and said input port of said amplifier, while coupling the other of said capacitors between said input port of said amplifier and said output port of said amplifier, such that said first capacitor and said second capacitor are selected from sample to sample, according to a predetermined procedure uncorrelated with said analog signal, for coupling between said stage input port and ground.

9. A method according to claim 8, wherein said step of coupling said first capacitor and said second capacitor at a sample time between said stage input port and ground is performed by coupling said first capacitor and said second capacitor at a sample time between said stage input port and virtual ground.

10. A method according to claim 8, wherein said step of coupling said first capacitor and said second capacitor at a sample time between said stage input port and ground is performed by coupling said first capacitor and said second capacitor at a sample time between said stage input port and an AC ground of said converter.

11. A method according to claim 8, wherein said step of coupling said first capacitor and said second capacitor at a sample time between said stage input port and ground is performed by coupling said first capacitor and said second capacitor at a sample time between said stage input port and an DC ground of said converter.

12. A method according to claim 8, wherein said reference voltage may be at one of a plurality of voltage levels.

13. A method according to claim 8, wherein said step of coupling one or more of said plurality of capacitors between a reference voltage and said input port of said amplifier is performed such that each of said plurality of capacitors is coupled between said reference voltage and said input port of said amplifier substantially the same number of times, over many of said amplifying periods.

14. A method according to claim 8, wherein said predetermined procedure is pseudo-random selection.

* * * * *